(12) United States Patent
Weng et al.

(10) Patent No.: US 6,511,779 B1
(45) Date of Patent: Jan. 28, 2003

(54) METHOD FOR FABRICATING HIGH RESOLUTION COLOR FILTER IMAGE ARRAY OPTOELECTRONIC MICROELECTRONIC FABRICATION

(75) Inventors: Fu-Tien Weng, Taow-Yuan (TW);
Chiu-Kung Chang, Hsin-Chu (TW);
Yu-Kung Hsiao, Tao-Yuan (TW);
Bii-Junq Chang, Hsin-Chu (TW);
Kuo-Lian Lu, Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 278 days.

(21) Appl. No.: 09/634,776

(22) Filed: Aug. 9, 2000

(51) Int. Cl.[7] ................................. G02D 5/20
(52) U.S. Cl. ......................... 430/7; 430/394
(58) Field of Search ............. 430/7, 312, 394, 430/321

(56) References Cited

U.S. PATENT DOCUMENTS 4,339,514 A    7/1982   Biber
5,008,166 A  * 4/1991   Aoki ........................... 430/7
5,563,011 A   10/1996   Shipley
6,008,872 A   12/1999   den Boer et al.

* cited by examiner

Primary Examiner—John A. McPherson
(74) Attorney, Agent, or Firm—Tung & Associates

(57) ABSTRACT

Within a method for forming an image array optoelectronic microelectronic fabrication there is first provided a substrate. There is then formed at least in part over the substrate a bidirectional array of image array optoelectronic microelectronic pixel elements comprising a plurality of series of patterned color filter layers corresponding with a plurality of colors. Within the method, at least one series of patterned color filter layers within the plurality of series of patterned color filter layers corresponding with at least one color within the plurality of colors is formed employing a photolithographic method which employs a plurality of separate photoexposure steps for forming a plurality of separate sub-series of patterned color filter layers within the series of patterned color filter layers corresponding with the at least one color within the plurality of colors. By employing the plurality of separate photoexposure steps for forming the plurality of separate sub-series of patterned color filter layers within the series of patterned color filter layers corresponding with the at least one color within the plurality of colors, the image array optoelectronic microelectronic fabrication is formed with enhanced resolution.

17 Claims, 2 Drawing Sheets

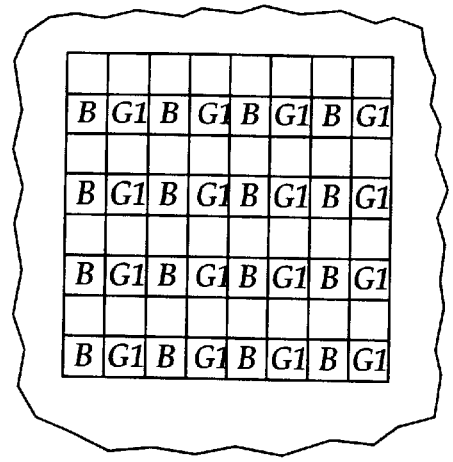
_Figure 4_
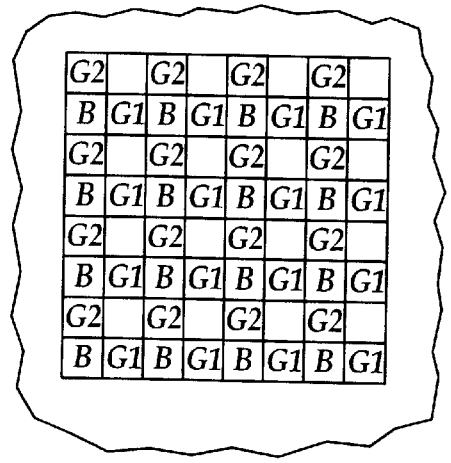
_Figure 5_
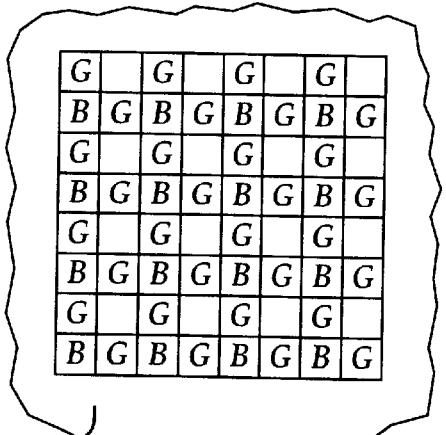
_Figure 6_
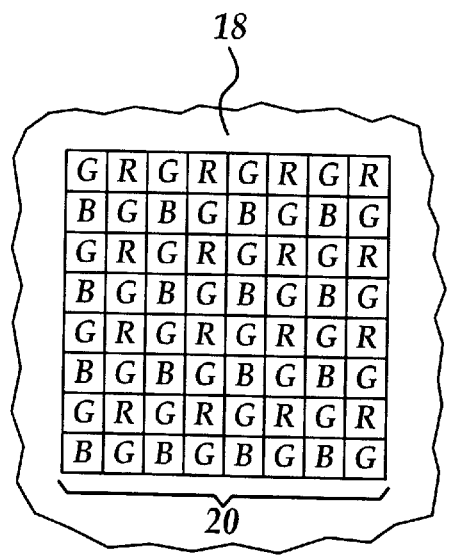
_Figure 7_

METHOD FOR FABRICATING HIGH RESOLUTION COLOR FILTER IMAGE ARRAY OPTOELECTRONIC MICROELECTRONIC FABRICATION

BACKGROUND OF THE INVENTION

1. Field of the Invention

The present invention relates generally to methods for fabricating image array optoelectronic microelectronic fabrications. More particularly, the present invention relates to methods for fabricating with enhanced resolution image array optoelectronic microelectronic fabrications.

2. Description of the Related Art

Microelectronic fabrications are formed from microelectronic substrates over which are formed patterned microelectronic conductor layers which are separated by microelectronic dielectric layers. Within the general category of microelectronic fabrication, there exist in a first instance microelectronic fabrications whose operation is based solely upon electrical signal storage and processing characteristics of microelectronic devices and microelectronic circuits formed upon a microelectronic substrate. Examples of such microelectronic fabrications typically include semiconductor integrated circuit microelectronic fabrications and ceramic substrate packaging microelectronic fabrications. Similarly, in a second instance, there also exists within the general category of microelectronic fabrication microelectronic fabrications whose operation is predicated upon a codependent transduction, storage and/or processing of optical and electrical signals while employing optoelectronic microelectronic devices formed upon a microelectronic substrate. Examples of such optoelectronic microelectronic fabrications typically include, but are not limited to: (1) solar cell optoelectronic microelectronic fabrications, as well as; (2) image array optoelectronic microelectronic fabrications, such as but not limited to: (a) sensor image array optoelectronic microelectronic fabrications (i.e. color filter sensor image arrays), as well as: (b) display image array optoelectronic microelectronic fabrications (i.e. flat panel display image arrays). Sensor image array optoelectronic microelectronic fabrications find common usage in advanced consumer products such as digital cameras, while display image array optoelectronic microelectronic fabrications are well recognized and commonly employed as visual interface elements within mobile computers.

While the level of complexity and integration of both purely electronic microelectronic fabrications and optoelectronic microelectronic fabrications continues to increase, fabrication of advanced optoelectronic microelectronic fabrications often provides unique fabrication challenges insofar as fabrication of advanced optoelectronic microelectronic fabrications requires attention to both the optical properties and the electrical properties of materials which are employed in forming such advanced optoelectronic microelectronic fabrications. For example, of the problems which are commonly encountered when fabricating advanced image array optoelectronic microelectronic fabrications, problems in achieving enhanced resolution, and in particular enhanced color filter resolution within a color filter image array optoelectronic microelectronic fabrication, is often encountered.

It is thus towards the goal of forming advanced image array optoelectronic microelectronic fabrications with enhanced resolution, and in particular advanced color filter image array optoelectronic microelectronic fabrications with enhanced color filter resolution, that the present invention is directed.

Various optoelectronic microelectronic fabrication methods and/or resulting optoelectronic microelectronic fabrications have been disclosed in the art of optoelectronic microelectronic fabrication for forming optoelectronic microelectronic fabrications with enhanced properties within the art of optoelectronic microelectronic fabrication.

For example, Biber, in U.S. Pat. No. 4,339,514, discloses a method for efficiently fabricating within a color filter image array optoelectronic microelectronic fabrication a plurality of series of patterned color filter layers such as to in turn fabricate the color filter image array optoelectronic microelectronic fabrication with enhanced efficiency. To realize the foregoing result, the method employs forming sequentially in registration with a plurality of series of optoelectronic devices within an optoelectronic microelectronic substrate a plurality of series of patterned photoresist layers which serve as precursor layers for forming a plurality of series of patterned color filter layers within the optoelectronic microelectronic fabrication, wherein each of the plurality of series of patterned photoresist layers is dyed with an appropriate dye prior to forming over the substrate an additional series of patterned photoresist layers which is subsequently dyed with a separate dye when forming the color filter image array optoelectronic microelectronic fabrication.

In addition, Shipley, in U.S. Pat. No. 5,563,011, discloses a color filter image array optoelectronic microelectronic fabrication which provides for enhanced optical properties when operating the color filter image array optoelectronic microelectronic fabrication. To realize the foregoing object, the color filter image array optoelectronic microelectronic fabrication is fabricated employing a passivating top coating layer which comprises an acrylic copolymer having hydroxyl and carboxylic acid functionality which may be cross-linked with a cross-linking agent while employing an acid or a base catalyst, and further wherein the acrylic copolymer having the hydroxyl and carboxylic acid functionality when cross-linked is cross-linked to provide the passivating top coating layer with enhanced optical clarity and attenuated shrinkage.

Finally, den Boer et al., in U.S. Pat. No. 6,008,872, discloses a color filter display image array optoelectronic microelectronic fabrication which may be efficiently fabricated while still providing the color filter display image array optoelectronic microelectronic fabrication with enhanced optical characteristics. To realize the foregoing objects, the color filter display image array optoelectronic microelectronic fabrication employs interposed between a pair of substrates: (1) a blanket color filter layer comprising a plurality of colors; and (2) a thin film diode which serves as a switching element with respect to a pixel electrode, wherein the pixel electrode accesses the thin film diode by means of an aperture within the color filter layer which otherwise passivates the thin film diode.

Desirable in the art of optoelectronic microelectronic fabrication are additional methods and materials which may be employed for forming image array optoelectronic microelectronic fabrications with enhanced resolution, and in particular for forming color filter image array optoelectronic microelectronic fabrications with enhanced color filter resolution.

It is towards the foregoing objects that the present invention is directed.

SUMMARY OF THE INVENTION

A first object of the present invention is to provide a method for forming an image array optoelectronic microelectronic fabrication.

A second object of the present invention is to provide a method for forming an image array optoelectronic microelectronic fabrication in accord with the first object of the present invention, where the image array optoelectronic microelectronic fabrication is formed with enhanced resolution.

A third object of the present invention is to provide a method in accord with the first object of the present invention and the second object of the present invention, which method is readily commercially implemented.

In accord with the objects of the present invention, there is provided by the present invention a method for forming a color filter image array optoelectronic microelectronic fabrication. To practice the method of the present invention, there is first provided a substrate. There is then formed at least in part over the substrate a bidirectional array of image array optoelectronic microelectronic pixel elements comprising a plurality of series of patterned color filter layers corresponding with a plurality of colors, and wherein the plurality of series of patterned color filter layers forms a blanket color filter layer. Within the method of the present invention, at least one series of patterned color filter layers within the plurality of series of patterned color filter layers corresponding with at least one color within the plurality of colors is formed employing a photolithographic method which employs a plurality of separate photoexposure steps for forming a plurality of separate sub-series of patterned color filter layers within the series of patterned color filter layers corresponding with the at least one color within the plurality of colors.

There is provided by the present invention a method for forming an image array optoelectronic microelectronic fabrication, where the image array optoelectronic microelectronic fabrication is formed with enhanced resolution. The present invention realizes the foregoing object by employing when forming a color filter image array optoelectronic microelectronic fabrication a bidirectional array of image array optoelectronic microelectronic pixel elements comprising a plurality of series of patterned color filter layers corresponding with a plurality of colors, where the plurality of series of patterned color filter layers forms a blanket color filter layer, and wherein at least one series of patterned color filter layers within the plurality of series of patterned color filter layers corresponding with at least one color within the plurality of colors is formed employing a photolithographic method which employs a plurality of separate photoexposure steps for forming a plurality of separate sub-series of patterned color filter layers within the series of patterned color filter layers corresponding with the at least one color within the plurality of colors.

The present invention is readily commercially implemented. As will be illustrated in conjunction with the Description of the Preferred Embodiment which follows, the present invention employs methods and materials as are generally known in the art of optoelectronic microelectronic fabrication, and more specifically known in the art of image array optoelectronic microelectronic fabrication, and yet more specifically known in the art of color filter image array optoelectronic microelectronic fabrication, but wherein such methods and materials are employed within the context of fabrication process controls and design considerations which provide at least in part the present invention. Since it is thus a process control, in conjunction with a design consideration, which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 2, FIG. 3, FIG. 4, FIG. 5, FIG. 6 and FIG. 7 show a series of schematic plan-view diagrams illustrating the results of progressive stages in forming within a color filter diode sensor image array optoelectronic microelectronic fabrication derived from the color filter diode sensor image array optoelectronic microelectronic fabrication whose schematic cross-sectional diagram is illustrated in FIG. 1 the blanket color filter layer in accord with the present invention.

DESCRIPTION OF THE PREFERRED EMBODIMENT

There is provided by the present invention a method for forming an image array optoelectronic microelectronic fabrication, where the image array optoelectronic microelectronic fabrication is formed with enhanced resolution. The present invention realizes the foregoing object by employing when forming a color filter image array optoelectronic microelectronic fabrication a bidirectional array of image array optoelectronic microelectronic pixel elements comprising a plurality of series of patterned color filter layers corresponding with a plurality of colors, wherein at least one series of patterned color filter layers within the plurality of series of patterned color filter layers corresponding with at least one color within the plurality of colors is formed employing a photolithographic method which employs a plurality of separate photoexposure steps for forming a plurality of separate sub-series of patterned color filter layers within the series of patterned color filter layers corresponding with the at least one color within the plurality of colors.

Although the preferred embodiment of the present invention illustrates the present invention within the context of a color filter diode sensor image array optoelectronic microelectronic fabrication wherein a plurality of sub-series of patterned green color filter layers within a blanket color filter layer are formed employing a plurality of separate photoexposure steps in accord with the method of the present invention, the method of the present invention may be employed for forming with enhanced resolution color filter image array optoelectronic microelectronic fabrications including but not limited to color filter sensor image array optoelectronic microelectronic fabrications as well as color filter display image array optoelectronic microelectronic fabrications, further wherein a series of patterned color filter layers which is formed employing the method of the present invention may be formed employing a sub-series of patterned color filter layers of colors including but not limited to red, green, blue, yellow, cyan and magenta.

Figure 1:
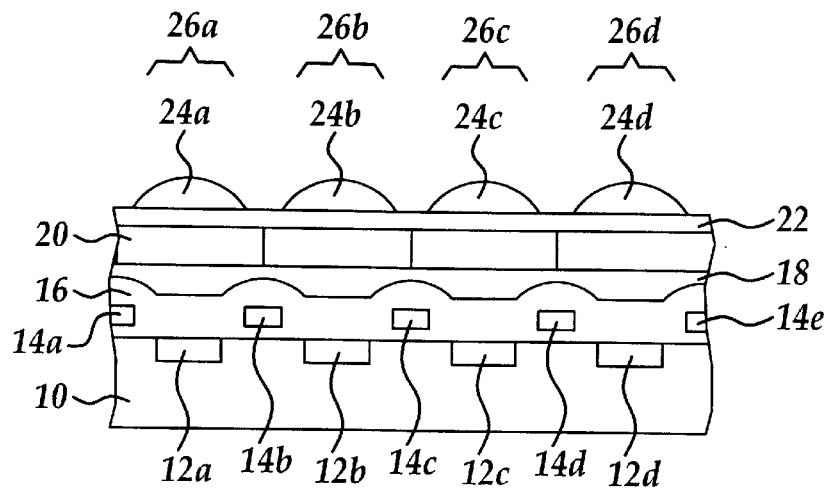
FIG. 1 shows a schematic cross-sectional diagram of a color filter diode sensor image array optoelectronic microelectronic fabrication which may have fabricated therein a blanket color filter layer fabricated in accord with the present invention.

Referring now to FIG. 1, there is shown a schematic cross-sectional diagram illustrating a portion of a color filter diode sensor image array optoelectronic microelectronic fabrication within which may be fabricated a blanket color filter layer in accord with the present invention and the preferred embodiment of the present invention.

Shown within FIG. 1, in a first instance, is a substrate 10 having formed therein a series of photo active regions 12a, 12b, 12c and 12d. Within the preferred embodiment of the present invention with respect to the substrate 10 and the series of photo active regions 12a, 12b, 12c and 12d, the substrate 10 is typically and preferably a silicon semiconductor substrate and the series of photo active regions 12a, 12b, 12c and 12d is typically and preferably a series of photodiode regions within the silicon semiconductor substrate. Typically and preferably, the silicon semiconductor substrate will have an N- or P- doping, while the series of photo active regions 12a, 12b, 12c and 12d will typically and preferably have a complementary P+ or N+ doping. Although FIG. 1 illustrates the substrate 10 as a flat substrate having the series of photo active regions 12a, 12b, 12c and 12d formed contiguously therein, as is understood by a person skilled in the art, the series of photo active regions 12a, 12b, 12c and 12d may also be formed topographically within the substrate 10, and the substrate 10 may also have formed therein additional appropriate layers and structures, such as but not limited to channel stop layers and channel stop structures, as are needed to adequately isolate the series of photo active regions 12a, 12b, 12c and 12d within the substrate 10.

Shown also within FIG. 1 formed upon and covering the substrate 10 including the series of photo active regions 12a, 12b, 12c and 12d is a blanket passivation layer 16 which has formed therein at locations alternating with the series of photo active regions 12a, 12b, 12c and 12d a series of patterned conductor layers 14a, 14b, 14c, 14d and 14e. The series of patterned conductor layers 14a, 14b, 14c, 14d and 14e typically serves as a first directional charge collection array within the color filter diode sensor image array optoelectronic microelectronic fabrication whose schematic cross-sectional diagram is illustrated in FIG. 1, while the blanket passivation layer 16 serves to separate the patterned conductor layers 14a, 14b, 14c, 14d and 14e from the substrate 10 and the series of photo active regions 12a, 12b, 12c and 12d.

Within the preferred embodiment of the present invention with respect to the blanket passivation layer 16, the blanket passivation layer 16 is typically and preferably formed of a passivation material which is transparent to incident electromagnetic radiation for whose detection and classification the color filter diode sensor image array optoelectronic microelectronic fabrication whose schematic cross-sectional diagram is illustrated in FIG. 1 is designed. Typically and preferably, the blanket passivation layer 16 is formed of a passivation material selected from the group including but not limited to silicon oxide passivation materials, silicon nitride passivation materials, silicon oxynitride passivation materials and composites thereof.

Similarly, within the preferred embodiment of the present invention with respect to the series of patterned conductor layers 14a, 14b, 14c, 14d and 14e, each of the series of patterned conductor layers 14a, 14b, 14c, 14d and 14e is formed of a conductor material as is similarly also conventional in the art of optoelectronic microelectronic fabrication, such conductor materials being selected from the group including but not limited to metal, metal alloy, doped polysilicon and polycide (doped polysilicon/metal silicide stack) conductor materials.

Shown also within FIG. 1 formed upon the blanket passivation layer 16 is a blanket planarizing layer 18, and there is similarly also shown within FIG. 1 formed upon the blanket planarizing layer 18 a blanket color filter layer 20. Within the preferred embodiment of the present invention with respect to the blanket planarizing layer 18, the blanket planarizing 18 layer may be formed employing methods and materials as are conventional in the art of optoelectronic microelectronic fabrication. Typically and preferably, the blanket planarizing layer 18 is formed of a planarizing material which, similarly with the blanket passivation layer 16, is transparent to a spectrum of electromagnetic radiation whose detection and classification is effected while employing the color filter diode sensor image array optoelectronic microelectronic fabrication whose schematic cross-sectional diagram is illustrated in FIG. 1. Such planarizing materials may include, but are not limited to spin-on-glass (SOG) planarizing materials and spin-on-polymer (SOP) planarizing materials. For the preferred embodiment of the present invention, the blanket planarizing layer 18 is preferably formed of a spin-on-glass (SOG) planarizing material, preferably formed to a thickness of from about 15,000 to about 25,000 angstroms upon the blanket passivation layer 16.

Within the preferred embodiment of the present invention with respect to the blanket color filter layer 20, as is understood by a person skilled in the art, and in accord with additional disclosure which follows, the method through which is formed the blanket color filter layer 20 provides at least in part the present invention. Similarly, although not completely illustrated within the schematic cross-sectional diagram of FIG. 1, the blanket color filter layer 20 typically and preferably comprises a bidirectional array of patterned color filter layers, wherein the bidirectional array of patterned color filter layers will typically and preferably comprise (or more preferably consist of) a triplet of colors, such as but not limited to: (1) red, green and blue; and (2) yellow, cyan and magenta.

Finally, there is also shown in FIG. 1 formed upon the blanket color filter layer 20 a blanket spacer layer 22 having formed spaced thereupon a series of patterned microlens layers 24a, 24b, 24c and 24d.

Within the preferred embodiment of the present invention with respect to the blanket spacer layer 22, the blanket spacer layer 22 is preferably formed of a spacer material which is intended to separate the series of patterned microlens 24a, 24b, 24c and 24d from the blanket color filter layer 20. Thus, similarly with the blanket passivation layer 16 and the blanket planarizing layer 18, the blanket spacer layer 22 is typically and preferably formed of spacer material which is transparent to a spectrum of incident electromagnetic radiation whose detection and classification is effected by the color filter diode sensor image array optoelectronic microelectronic fabrication whose schematic cross-sectional diagram is illustrated in FIG. 1. Thus, also similarly with the blanket passivation layer 16, the blanket spacer layer 22 may also be formed from a spacer material selected from the group consisting of silicon oxide materials, silicon nitride materials, silicon oxynitride materials, as well as spin-on-polymer (SOP) materials, and composites thereof. Typically and preferably, the blanket spacer layer 22 is formed to a thickness of from about 15,000 to about 25,000 angstroms upon the blanket color filter layer 20.

Finally, within the preferred embodiment of the present invention with respect to the series of patterned microlens layers 24a, 24b, 24c and 24d, the series of patterned microlens layers 24a, 24b, 24c and 24d is, as is conventional in the art of optoelectronic microelectronic fabrication, formed of a patterned photoresist material of appropriate optical properties, which patterned photoresist layer is then thermally reflowed to form the series of patterned microlens layers 24a, 24b, 24c and 24d of convex shape, as illustrated within the schematic cross-sectional diagram of the color filter diode sensor image array optoelectronic microelectronic fabrication as illustrated in FIG. 1.

As is illustrated within the schematic cross-sectional diagram of FIG. 1, each portion of the color filter diode sensor image array optoelectronic microelectronic fabrication whose schematic cross-sectional diagram is illustrated in FIG. 1 which includes a patterned microlens layer 24a, 24b, 24c or 24d, in conjunction with a corresponding photo active region 12a, 12b, 12c or 12d of the substrate 10 comprises an active pixel element 26a, 26b, 26c or 26d of the color filter diode sensor image array optoelectronic microelectronic fabrication.

Figure 2:
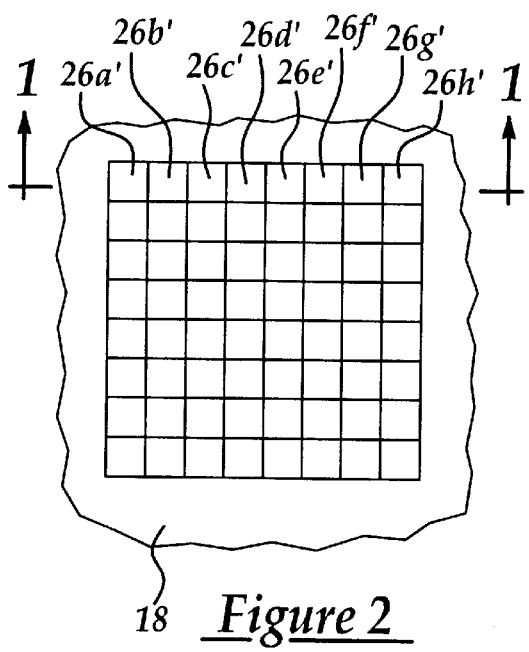

Referring now to FIG. 2 to FIG. 7, there is shown a series of schematic plan-view diagrams illustrating the results of progressive stages of forming, in accord with a preferred embodiment of the present invention, the blanket color filter layer 20 within a predecessor color filter diode sensor image array optoelectronic microelectronic fabrication derived from the color filter diode sensor image array optoelectronic microelectronic fabrication whose schematic cross-sectional diagram is illustrated in FIG. 1. Shown in FIG. 2 is a schematic plan-view diagram of the predecessor color filter diode sensor image array optoelectronic microelectronic fabrication prior to having formed therein the blanket color filter layer 20.

Shown in FIG. 2 is a schematic plan-view diagram of the color filter sensor image array optoelectronic microelectronic fabrication corresponding with the color filter sensor image array optoelectronic microelectronic fabrication whose schematic cross-sectional diagram is illustrated in FIG. 1, but wherein there is absent the blanket color filter layer 20, the blanket spacer layer 22 and the series of patterned microlens layers 24a, 24b, 24c and 24d to leave an exposed top surface of the blanket planarizing layer 18. Thus, there is also illustrated within the schematic plan-view diagram of FIG. 2 a series of incomplete pixel elements 26a', 26b', 26c', 26d', 26e', 26f', 26g' and 26h' wherein the cross-sectional division 1'—1' of the first four of which correspond generally with the active pixel elements 26a, 26b, 26c and 26d as illustrated within the schematic cross-sectional diagram of FIG. 1. As is similarly also illustrated within the schematic plan-view diagram of FIG. 2, the series of incomplete pixel elements 26a', 26b', 26c', 26d', 26e', 26f', 26g' and 26h' is derived from a bidirectional array of incomplete pixel elements.

Figure 3:
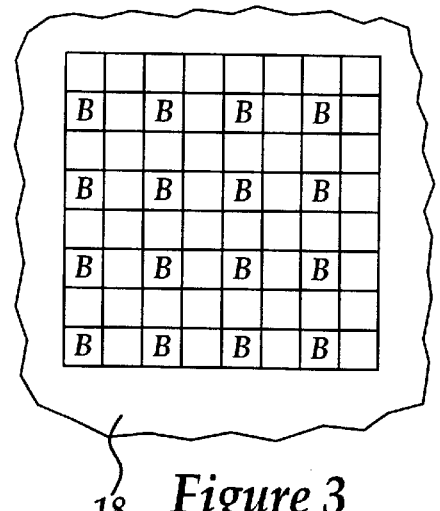

Referring now to FIG. 3, there is shown a schematic plan-view diagram illustrating the results of further processing of the color filter diode sensor image array optoelectronic microelectronic fabrication whose schematic plan-view diagram is illustrated in FIG. 2.

Shown in FIG. 3 is a schematic plan-view diagram of a color filter diode sensor image array optoelectronic microelectronic fabrication otherwise equivalent to the color filter diode sensor image array optoelectronic microelectronic fabrication whose schematic plan-view diagram is illustrated in FIG. 2, but wherein there is shown formed symmetrically over each fourth incomplete pixel element within the bidirectional array of incomplete pixel elements a patterned color filter layer designated as a "B" patterned color filter layer which is intended to signify a series of patterned blue color filter layers.

Within the preferred embodiment of the present invention the series of patterned blue color filter layers may be formed employing methods and materials as are conventional in the art of color filter image array optoelectronic microelectronic fabrication, such methods and materials including but not limited to photolithographic exposure and development methods employing photoresist materials which are either: (1) intrinsically or extrinsically pigmented or dyed blue when formed as a blanket photoresist layer; or (2) dyed blue after being formed as a patterned photoresist layer. Such photoresist materials may be selected from the group including but not limited to positive photoresist materials and negative photoresist materials. More typically and preferably, the series of patterned blue color filter layers is formed employing a selective photoexposure and development of a blanket blue photoresist layer formed of a negative photoresist material having incorporated therein a blue pigment. Typically and preferably, the series of patterned blue color filter layers is formed to a thickness of from about 10,000 to about 20,000 angstroms.

Referring now to FIG. 4, there is shown a schematic plan-view diagram illustrating the results of further processing the color filter diode sensor image array optoelectronic microelectronic fabrication whose schematic plan-view diagram is illustrated in FIG. 3.

Shown in FIG. 4 is a schematic plan-view diagram of a color filter diode sensor image array optoelectronic microelectronic fabrication otherwise equivalent to the color filter diode sensor image array optoelectronic microelectronic fabrication whose schematic plan-view diagram is illustrated in FIG. 3, but wherein, although not specifically clearly illustrated within the schematic plan-view diagram of FIG. 4, there is first formed a blanket green photoresist layer over the color filter sensor image array optoelectronic microelectronic fabrication including the patterned blue color filter layers. The blanket green photoresist layer is then selectively photoexposed, in a series of areas adjoining the patterned blue color filter layers, to form a series of first latent photoexposed green images G1. Such selective photoexposure is undertaken employing a first photomask as is otherwise conventional in the art of image array optoelectronic microelectronic fabrication. As is understood by a person skilled in the art, at this point in processing of the color filter diode sensor image array optoelectronic microelectronic fabrication whose schematic cross-sectional diagram is illustrated in FIG. 4, the selectively once selectively photoexposed blanket green photoresist layer is not developed to form a series of patterned green color filter layers. Similarly, from a practical perspective, in order to form the once selectively photoexposed blanket green photoresist layer as illustrated in the schematic plan-view diagram of FIG. 4 there is typically and preferably employed a negative photoresist material when forming the blanket green photoresist layer and more typically and preferably an intrinsically or extrinsically pigmented or dyed green photoresist material, although alternatively there may be employed within the present invention and the preferred embodiment of the present invention an unpigmented or undyed photoresist material which is subsequently dyed with a green dye after having been completely photoexposed and developed. Typically and preferably, the blanket green photoresist layer is formed to a thickness of from about 10,000 to about 20,000 angstroms.

Referring now to FIG. 5, there is shown a schematic plan-view diagram illustrating the results of further processing of the color filter sensor image array optoelectronic microelectronic fabrication whose schematic plan-view diagram is illustrated in FIG. 4.

Shown in FIG. 5 is a schematic plan-view diagram of a color filter sensor image array optoelectrtonic microelectronic fabrication otherwise equivalent to the color filter sensor image array optoelectronic microelectronic fabrication whose schematic plan-view diagram is illustrated in FIG. 4, but wherein the once selectively photoexposed blanket green photoresist layer has been further photoexposed to form a twice selectively photoexposed blanket green photoresist layer having formed therein a series of second latent photoexposed green images G2, which also adjoin the series of patterned blue color filter layers.

To form from the once selectively photoexposed blanket green photoresist layer having formed therein the series of first latent photoexposed green images G1 as illustrated within the schematic plan-view diagram of FIG. 4 the twice selectively photoexposed blanket green photoresist layer having formed therein the series of first latent photoexposed green images G1 and the series of second latent photoexposed green images G2 as illustrated within the schematic plan-view diagram of FIG. 5, there is employed a second photomask which typically and preferably does not provide for any overlap when forming the series of first latent photoexposed green images G1 and the series of second latent photoexposed green images G2.

By employing within the context of the present invention and the preferred embodiment of the present invention two separate and independent masks and photoexposures for forming the series of first latent photoexposed green images G1 and the series of second latent photoexposed green images G2 within the twice selectively photoexposed blanket green photoresist layer, it has been observed experimentally that a series of patterned green color filter layers formed from the series of first latent photoexposed green images G1 and the series of second latent photoexposed green images G2 within the twice selectively photoexposed blanket green photoresist layer is formed with attenuated residue formation and enhanced patterned green color filter layer profile, thus providing enhanced resolution, and in particular enhanced color filter resolution, within a color filter diode sensor image array optoelectronic microelectronic fabrication formed from the color filter sensor image array optoelectronic microelectronic fabrication whose schematic plan-view diagram is illustrated in FIG. 5. Further, such advantage of the present invention in providing a color filter diode sensor image array optoelectronic microelectronic fabrication with enhanced resolution is obtained in particular when the series of patterned green color filter layers is formed of a bidirectional linewidth of less than about 5 microns, more preferably from about 3 to about 5 micron and most preferably from about 3 to about 5 microns.

Referring now to FIG. 6, there is shown a schematic plan-view diagram illustrating the results of further processing of the color filter diode sensor image array optoelectronic microelectronic fabrication whose schematic plan-view diagram is illustrated in FIG. 5.

Shown in FIG. 6 is a schematic plan-view diagram of a color filter diode sensor image array optoelectronic microelectronic fabrication otherwise equivalent with the color filter diode sensor image array optoelectronic microelectronic fabrication whose schematic plan-view diagram is illustrated in FIG. 5, but wherein the twice selectively photoexposed blanket green photoreist layer having formed therein the series of first latent photoexposed green images G1 and the series of second photoexposed latent green images G2 has been developed to form a series of patterned green color filter layers, designated as "G", in part contiguous with the series of patterned blue color filter layers, designated as "B", both of which patterned green color filter layers and patterned blue color filter layers comprise in part the blanket color filter layer 20 as illustrated within the color filter sensor image array optoelectronic microelectronic fabrication whose schematic cross-sectional diagram is illustrated in FIG. 1.

Referring now to FIG. 7, there is shown a schematic plan-view diagram illustrating the results of further processing of the color filter diode sensor image array optoelectronic microelectronic fabrication whose schematic plan-view diagram is illustrated in FIG. 6.

Shown in FIG. 7 is a schematic plan-view diagram of a color filter diode sensor image array optoelectronic microelectronic fabrication otherwise equivalent to the color filter diode sensor image array optoelectronic microelectronic fabrication whose schematic plan-view diagram is illustrated in FIG. 6, but wherein there is shown covering the remaining incomplete pixel elements a series of patterned red color filter layers, designated as "R". Within the present invention and the preferred embodiment of the present invention, the series of patterned red color filter layers may be formed employing methods and materials analogous or equivalent to the methods and materials employed for forming the series of patterned blue color filter layers, but with the exception that the series of patterned red color filter layers is formed with a red dye or red pigment, rather than a blue dye or a blue pigment as is employed for forming the series of patterned blue color filter layers.

As is illustrated within the schematic plan-view diagram of FIG. 7, and as is understood by a person skilled in the art, the series of patterned blue color filter layers, the series of patterned green color filter layers and the series of patterned red color filter layers comprise, in an aggregate the blanket color filter layer 20 as is more particularly illustrated within the color filter diode sensor image array optoelectronic microelectronic fabrication whose schematic cross-sectional diagram is illustrated in FIG. 1.

As is understood by a person skilled in the art, although the preferred embodiment of the present invention illustrates the present invention within the context of forming a series of patterned green color filter layers which comprise approximately fifty percent areal density of a blanket color filter layer within a color filter diode sensor image array optoelectronic microelectronic fabrication, the present invention may alternatively be employed when forming any or all patterned color filter layers of high (typically greater than about 33 percent), equivalent (typically about 33 percent) or low (typically less than about 33 percent) areal density while employing any of several colors (including but not limited to red, green, blue, yellow, cyan and magenta) within color filter image array optoelectronic microelectronic fabrications including but not limited to color filter sensor image array optoelectronic microelectronic fabrications and color filter display image array optoelectronic microelectronic fabrications.

Upon forming upon the color filter diode sensor image array optoelectronic microelectronic fabrication whose schematic plan-view diagram is illustraareted in FIG. 7 the blanket spacer layer 22 and a bidirectional array of patterned microlens layers which includes the series of patterned microlens layers 24a, 24b, 24c and 24d as illustrated within the schematic cross-sectional diagram of FIG. 1, there is formed a color filter diode sensor image array optoelectronic microelectronic fabrication in accord with a preferred embodiment of the present invention. The color filter diode sensor image array optoelectronic microelectronic fabrication so formed is formed with enhanced resolution insofar as the series of patterned green color filter layers, while being formed from a single blanket green photoresist layer is formed employing a plurality of separate photoexposures of the blanket green photoresist layer when forming a corresponding plurality of series of latent photoexposed green images from which is formed the series of patterned green color filter layers.

As is finally understood by a person skilled in the art, the preferred embodiment of the present invention is illustrative of the present invention rather than limiting of the present invention. Revisions and modifications may be made to methods, materials, structures and dimensions which may be employed to form a color filter diode sensor image array optoelectronic microelectronic fabrication in accord with the preferred embodiment of the present invention while still forming an image array optoelectronic microelectronic fabrication in accord within the present invention, further in accord with the appended claims.

What is claimed is:

1. A method for forming an image array optoelectronic microelectronic fabrication comprising:

providing a substrate;

forming at least in part over the substrate a bidirectional array of image array optoelectronic microelectronic pixel elements comprising a plurality of series of patterned color filter layers corresponding with a plurality of colors, wherein at least one series of patterned color filter layers within the plurality of series of patterned color filter layers corresponding with at least one color within the plurality of colors is formed employing a photolithographic method which employs a plurality of separate photoexposure steps for forming a plurality of separate sub-series of patterned color filter layers within the series of patterned color filter layers corresponding with the at least one color within the plurality of colors.

2. The method of claim 1 wherein by employing the plurality of separate photoexposure steps for forming the plurality of separate sub-series of patterned color filter layers within the series of patterned color filter layers corresponding with the at least one color within the plurality of colors the image array optoelectronic microelectronic fabrication is formed with enhanced resolution.

3. The method of claim 1 wherein the substrate is employed within an image array optoelectronic microelectronic fabrication selected from the group consisting of color filter sensor image array optoelectronic microelectronic fabrications and color filter display image array optoelectronic microelectronic fabrications.

4. The method of claim 1 wherein the plurality of colors comprises red, blue and green.

5. The method of claim 1 wherein the plurality of colors comprises yellow, cyan and magenta.

6. The method of claim 1 wherein the plurality of sub-series of patterned color filter layers is each formed of a bidirectional linewidth of less than about 5 microns.

7. The method of claim 1 wherein the plurality of series of patterned color filter layers forms a blanket color filter layer.

8. The method of claim 1 wherein individual series of patterned color filter layers within the plurality of series of patterned color filter layers do not have an equivalent areal coverage over the substrate.

9. The method of claim 1 wherein the plurality of separate photoexposure steps is undertaken with respect to a single blanket photoresist layer from which is formed the plurality of separate sub-series of patterned color filter layers within the series of patterned color filter layers corresponding with the at least one color within the plurality of colors.

10. A method for forming an image array optoelectronic microelectronic fabrication comprising:

providing a substrate;

forming at least in part over the substrate a bidirectional array of image array optoelectronic microelectronic pixel elements comprising a plurality of series of patterned color filter layers corresponding with a plurality of colors comprising red, green and blue, wherein at least one series of patterned color filter layers within the plurality of series of patterned color filter layers corresponding with at least one color within the plurality of colors is formed employing a photolithographic method which employs a plurality of separate photoexposure steps for forming a plurality of separate sub-series of patterned color filter layers within the series of patterned color filter layers corresponding with the at least one color within the plurality of colors.

11. The method of claim 10 wherein by employing the plurality of separate photoexposure steps for forming the plurality of separate sub-series of patterned color filter layers within the series of patterned color filter layers corresponding with the at least one color within the plurality of colors the image array optoelectronic microelectronic fabrication is formed with enhanced resolution.

12. The method of claim 10 wherein the substrate is employed within an image array optoelectronic microelectronic fabrication selected from the group consisting of color filter sensor image array optoelectronic microelectronic fabrications and color filter display image array optoelectronic microelectronic fabrications.

13. The method of claim 10 wherein the plurality of colors consists of red, blue and green.

14. The method of claim 10 wherein the plurality of sub-series of patterned color filter layers is each formed of a bidirectional linewidth of less than about 5 microns.

15. The method of claim 10 wherein the series of patterned color filter layers forms a blanket color filter layer.

16. The method of claim 10 wherein individual series of patterned color filter layers within the plurality of series of patterned color filter layers do not have an equivalent areal coverage over the substrate.

17. The method of claim 10 wherein the plurality of separate photoexposure steps is undertaken with respect to a single blanket photoresist layer from which is formed the plurality of separate sub-series of patterned color filter layers within the series of patterned color filter layers corresponding with the at least one color within the plurality of colors.

* * * * *